United States Patent [19]
Park et al.

[11] Patent Number: 5,895,224
[45] Date of Patent: Apr. 20, 1999

[54] THREE-DIMENSIONAL CAVITY SURFACE EMITTING LASER STRUCTURE AND FABRICATION METHOD THEREOF

[75] Inventors: Hyo-Hoon Park; Hye-Yong Chu; Byueng-Su Yoo, all of Daejeon, Rep. of Korea

[73] Assignee: Electronics And Telecommunications Research Institute, Daejeon, Rep. of Korea

[21] Appl. No.: 08/915,298

[22] Filed: Aug. 20, 1997

[30] Foreign Application Priority Data

Dec. 20, 1996 [KR] Rep. of Korea ............. 96-69284

[51] Int. Cl.⁶ .................................................. H01L 21/20
[52] U.S. Cl. .................................. 438/39; 438/29; 372/96
[58] Field of Search ..................... 438/22, 29, 39; 372/92, 96

[56] References Cited

U.S. PATENT DOCUMENTS

| | | | |
|---|---|---|---|
| 5,316,968 | 5/1994 | Choquette | 437/105 |
| 5,351,257 | 9/1994 | Lebby et al. | 372/46 |
| 5,392,307 | 2/1995 | Sugiyama et al. | 372/45 |
| 5,658,824 | 8/1997 | Itoh et al. | 438/38 |
| 5,661,076 | 8/1997 | Yoo et al. | 438/39 |
| 5,675,605 | 10/1997 | Fujii | 372/96 |

*Primary Examiner*—Olik Chaudhuri
*Assistant Examiner*—Daniel H. Mao
*Attorney, Agent, or Firm*—Cohen, Pontani, Lieberman & Pavane

[57] ABSTRACT

A three-dimensional cavity surface emitting laser structure and a fabrication method thereof which are capable of effectively controlling the characteristic of the transverse mode by applying independent electrical field to a side wall of an active region and concentrating a current flow along, inside of the active region. The structure includes a protrusion portion of a bottom mirror region formed on a substrate, an insulation film formed in a sidewall of a laser post having an active region extended from the protrusion and a top mirror region, and a sidewall metal mirror layer electrically separated from n-type and p-type electrodes for independently applying an electric field.

3 Claims, 5 Drawing Sheets

THREE-DIMENSIONAL CAVITY SURFACE EMITTING LASER STRUCTURE AND FABRICATION METHOD THEREOF

BACKGROUND OF THE INVENTION

1. Field of the Invention

The present invention relates to a three-dimensional cavity surface emitting laser structure and a fabrication method thereof, and in particular, to an improved three-dimensional cavity surface emitting laser structure and a fabrication method thereof which are capable of enhancing a current injection efficiency and controlling a transverse mode by electrical fields applied on a metal mirror layer formed in a sidewall of a cavity and a current injection electrode and by adjusting a current injection path.

2. Description of the Conventional Art

In the conventional three-dimensional cavity laser device, since a metal mirror layer formed in a sidewall of a laser post contacts with a current injection electrode, it is impossible to independently generate electrical fields on a sidewall of a cavity. In addition, the sidewall metal mirror layer covers a part of the top mirror region. However, the sidewall metal mirror layer is not formed on a sidewall of an active region due to an electrical isolation problem. Therefore, it is impossible to provide a function of a sidewall reflector on the active region in which an optical resonance is most active.

SUMMARY OF THE INVENTION

Accordingly, it is an object of the present invention to provide a selective three-dimensional cavity surface emitting laser structure and a fabrication method thereof which overcome the aforementioned problems encountered in the conventional art.

It is another object of the present invention to provide an improved three-dimensional cavity surface emitting laser structure and a fabrication method thereof which are capable of enhancing a current injection efficiency and controlling a transverse mode by electrically separating a metal mirror layer formed on a sidewall of a cavity and a current injection electrode and by adjusting a current injection path.

It is another object of the present invention to provide an improved three-dimensional cavity surface emitting laser structure and a fabrication method thereof which are capable of increasing optical gain by forming a reflection film on a sidewall of an active region in which optical cavity is most active and by greatly reducing the loss of light.

It is another object of the present invention to provide an improved three-dimensional cavity surface emitting laser structure and a fabrication method thereof which are capable of effectively controlling the characteristic of the transverse mode by applying independent electrical field to a side wall of an active region and concentrating a current flow along inside of the active region.

To achieve the above objects, there is provided a three-dimensional cavity surface emitting laser structure which includes a protrusion portion of a bottom mirror region formed on a substrate, an insulation film formed on a sidewall of a laser post having an active region between the top mirror region and the protruded bottom mirror region, and a sidewall metal mirror layer electrically separated from n-type and p-type electrodes for independently applying an electric field on the sidewall.

To achieve the above objects, there is also provided a three-dimensional cavity surface emitting laser structure fabrication method which includes the steps of sequentially forming bottom mirror region, active region, and top mirror region on a semiconductor substrate, forming a first metal film pattern on the top mirror region which has functions of a p-type or n-type electrode and etching mash, etching a part of the top mirror region, active region and bottom mirror region by using the first metal film pattern as an etching mask, and forming a laser post, forming an insulation film on the resultant structure, forming a sidewall mirror second metal film pattern on the insulation film of a sidewall of the laser post, exposing a surface of the top electrode formed on the top mirror region, coating a planarization polyimide film on the upper surface of the resultant surface and forming a pad of a sidewall mirror second metal film, and forming a metal pad on the top electrode.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The three-dimensional cavity surface emitting laser structure according to the present invention includes a protrusion portion formed in a bottom mirror region formed on a substrate, an active region extended to the protrusion portion, and an insulation film formed on a sidewall of a laser post, and a sidewall metal mirror layer electrically separated between n-type and p-type electrodes and for independently forming electrical fields.

The three-dimensional cavity surface emitting laser structure according to the present invention will be explained in more detail with reference to the accompanying drawings.

Figure 1A:
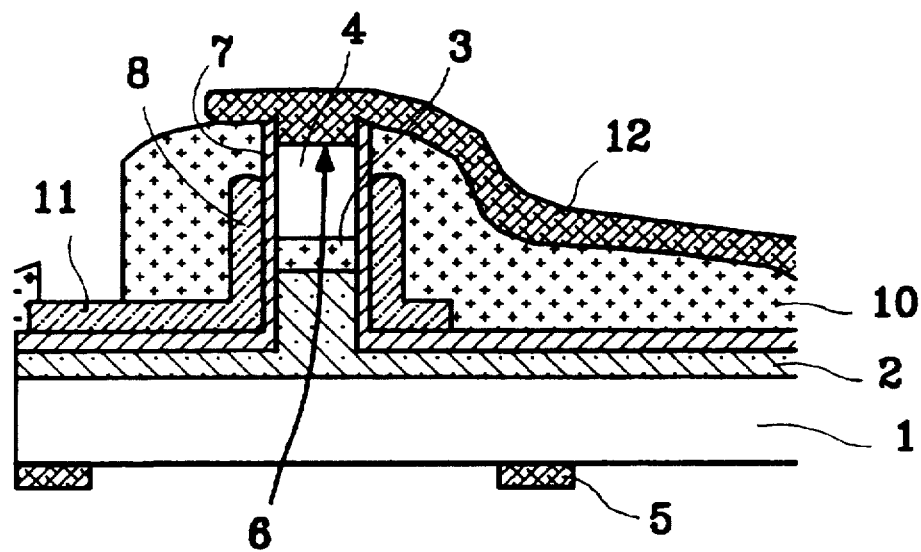
FIG. 1A is a cross-sectional view illustrating a surface emitting laser structure according to the present invention.

FIG. 1A illustrates a surface emitting laser structure according to the present invention.

As shown therein, a bottom mirror region 2 having a protrusion portion is formed on a substrate 1. An active region 3 and a top mirror region 4 are formed on the protrusion portion of the bottom mirror region 2, for thus forming a laser post. In addition, an insulation film 7 is formed on a sidewall of the laser post and the bottom mirror region 2 so that the upper sidewall-surface of the top mirror region 4 is exposed. A metal mirror layer 8 is formed on the sidewall of the laser post, symmetrically to the insulation film 7. In addition, a polyimide layer 10 is formed on the resultant structure except for a pad 11 for applying electric fields to the metal mirror layer. A top electrode of p-type or n-type 6 and a top electrode pad 12 contact with the top mirror region through the polyimide layer. In addition, a bottom electrode of n-type or p-type 5 is formed on the back side of the substrate 1.

Since the surface emitting laser according to the present invention includes the sidewall metal mirror layer 8 formed in a part of the top and bottom mirror regions 2 and 4 including the active region 3 and electrically separated from the top electrode 6 and the bottom electrode 5, it is possible to independently apply electric fields to the metal mirror layer 8 through the pad 11.

Figure 1B:
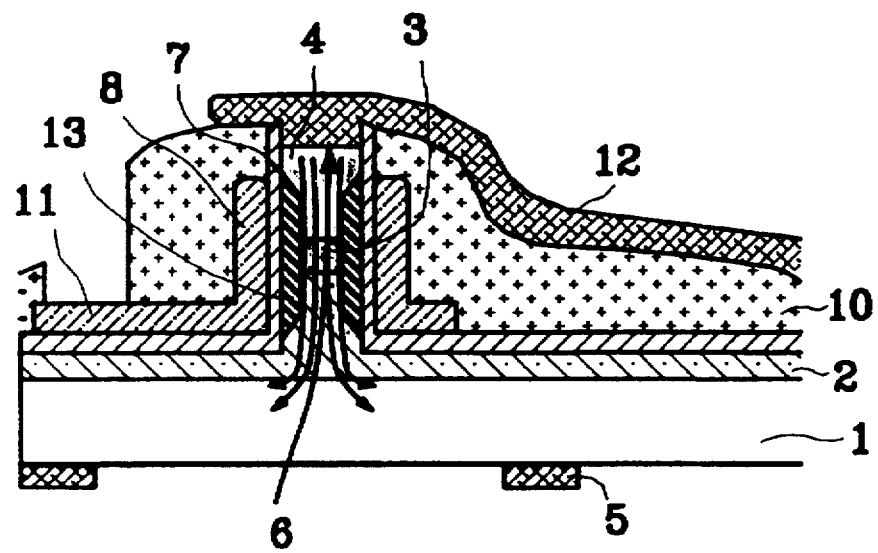
FIG. 1B is a cross-sectional view illustrating a surface emitting laser structure for explaining an operational principle of the same.

FIG. 1B illustrates a surface emitting laser structure for explaining an operational principle of the structure of FIG. 1A.

The sidewall metal mirror 8 reflects lights emitted from the active region 3, for thus increasing an optical gain in the active region 3. When electrical fields are applied to the metal mirror layer 8 through the pad 11, a region 13 in which a carrier is depleted near the sidewall thereof is formed, so that current flow along inside of the laser post. Therefore, it is possible to obtain a stable transverse mode by adjusting the current injection path.

FIGS. 2A through 2J illustrate a surface emitting laser structure fabrication method according to the present invention.

The fabrication method of the surface emitting laser according to the present invention will now be explained.

First, as shown in FIGS. 2A through 2J, a bottom mirror region 2, an active region 3, and a top mirror region 4 are sequentially formed on the semiconductor substrate 1, and a bottom electrode 5 is formed in the back side of the substrate. In addition, a top electrode is formed on the top mirror region 4, and a metal film pattern 6 is formed thereon, which pattern is used as an etching mask.

Figure 2A:
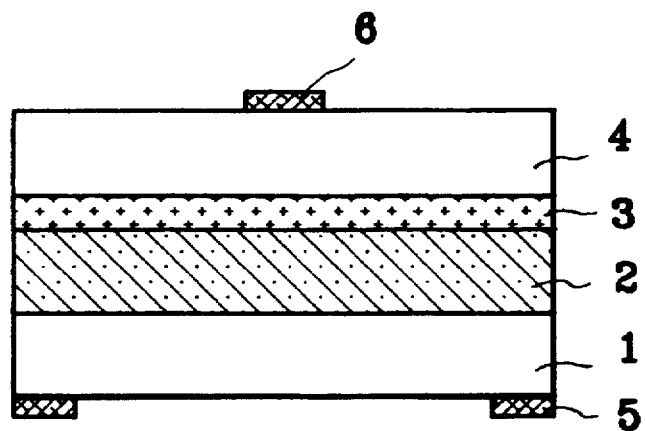
FIGS. 2A through 2J are cross-sectional views illustrating a surface emitting laser structure fabrication method according to the present invention.
Figure 2B:
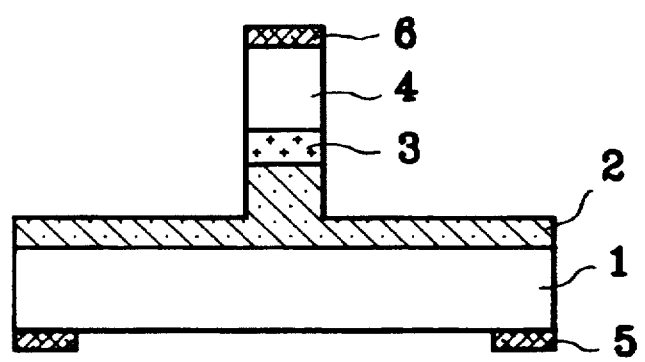
Figure 2C:
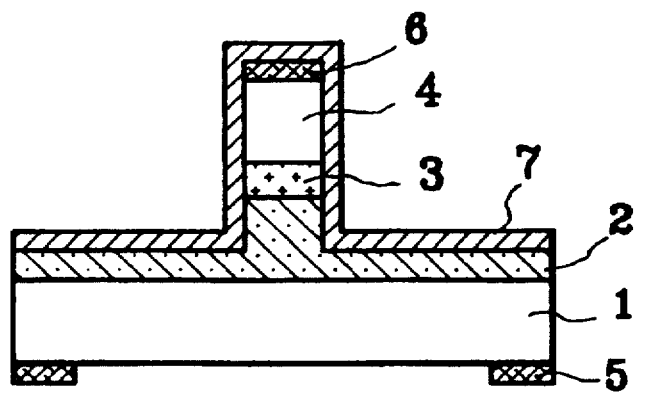

Thereafter, as shown in FIG. 2B, the laser post is formed by a dry etching method by using the metal film 6 as a mask. At this time, the top mirror region 4 and the active region 3 are all etched, and a part of the bottom mirror region 2 is etched.

Thereafter, the insulation film 7 is deposited on the entire surface of the resultant structure by a thickness of 1000 A to 5000 A.

Figure 2D:
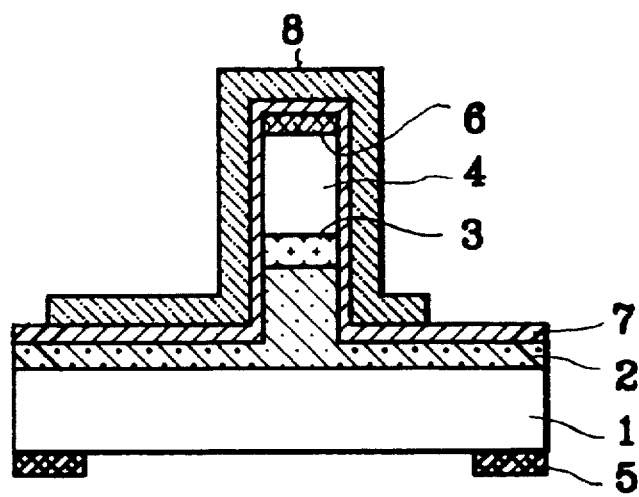

Continuously, as shown in FIG. 2D, the sidewall mirror metal film 8 is deposited on the insulation film 7. In this step, the substrate surface is made slanted with respect to the direction of the beam direction, for thus depositing the metal film on the sidewall of the laser post.

Figure 2E:
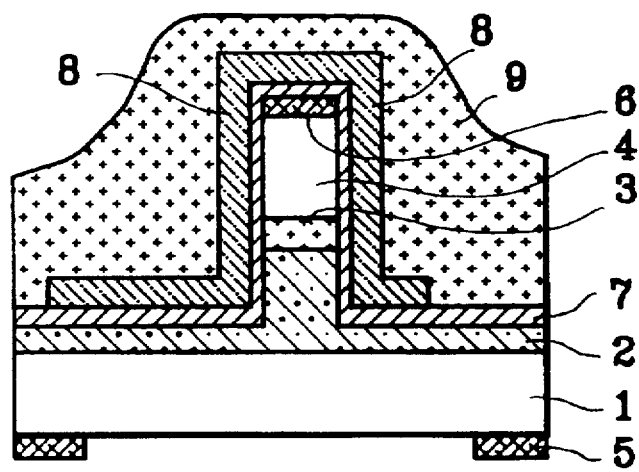

Thereafter, as shown in FIG. 2E, the photoresist or polyimide 9 is coated in order to expose the top electrode 6. In this step, the photoresist film or the polyimide film is coated by spin coating method on the upper portion of the laser post to have a thickness thinner than the portion surrounding the same in cooperation with the protrusion.

Figure 2F:
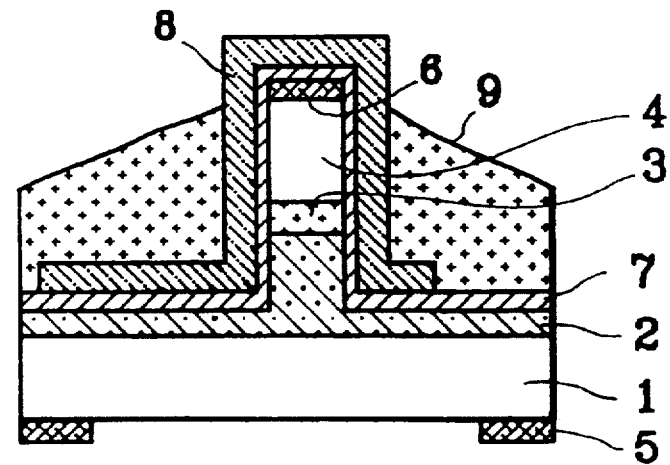

As shown in FIG. 2F, the upper portion of the photoresist film or polyimide film 9 is ashed by using oxygen plasma, for thus exposing the metal film 8 formed on the p-type electrode 6. In this step, the polyimide film formed in the upper portion of the laser post is thinner than the portion surrounding the same, and the photoresist film or polyimide film is ashed from the upper portion, for thus exposing the upper portion of the laser post, and on the surrounding portion there are left the photoresist film or polyimide film. Thereafter, the ashing process is finished.

Figure 2G:
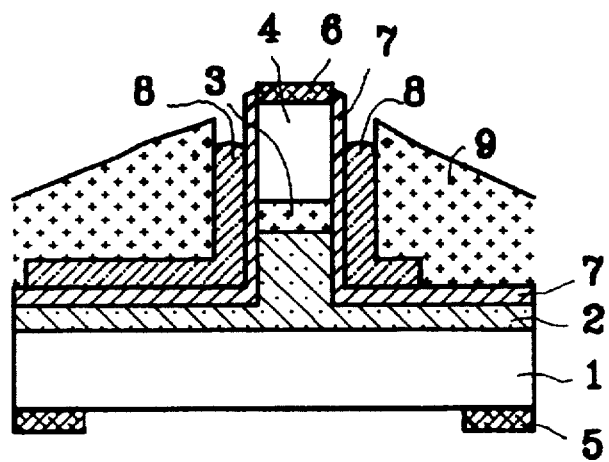

Continuously, as shown in FIG. 2G, the sidewall mirror metal film 8 which is the exposed portion of the laser post is removed by an ion milling method or wet etching method, and then the insulation film 7 formed therebelow is removed, for thus fully exposing the top electrode 6.

Figure 2H:
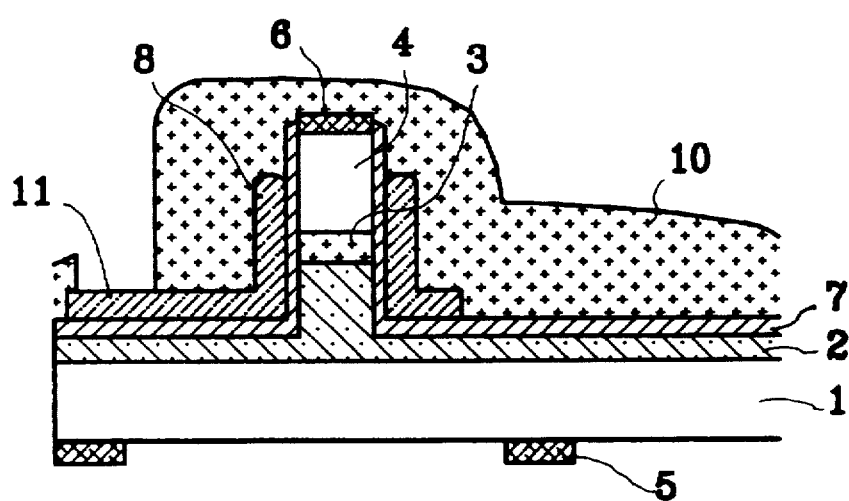

The polyimide film 10 is coated for a planarization as shown in FIG. 2H, and then the pad 11 of the sidewall mirror metal film is exposed.

Figure 2I:
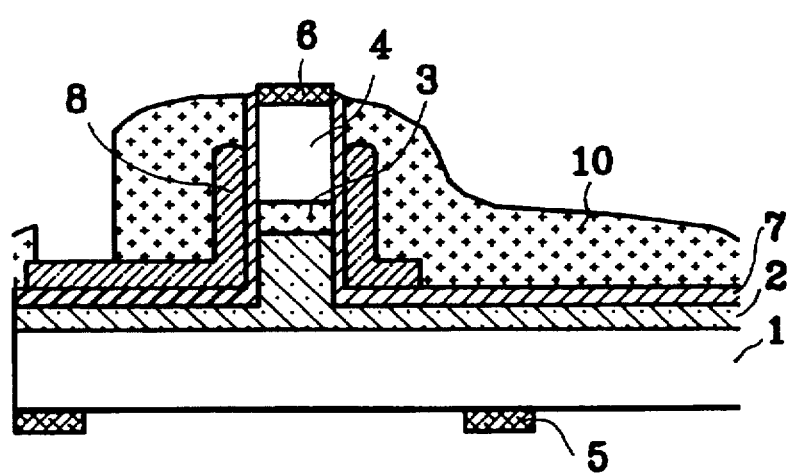
Figure 2J:
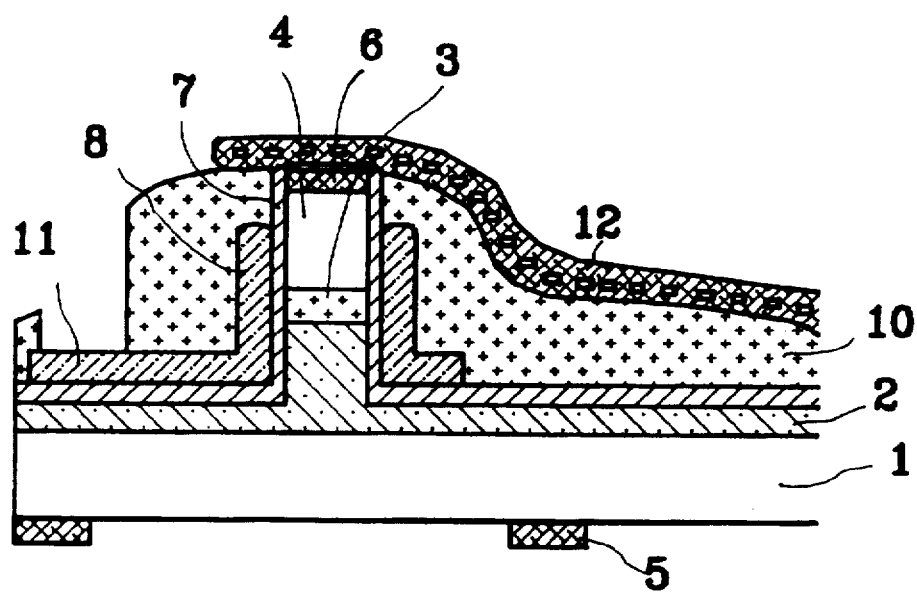

Finally, as shown in FIG. 2I, the surface of the polyimide film 10 is ashed by oxygen plasma, for thus exposing the top electrode 6, and as shown in FIG. 2J, a metal pad 12 is formed on the top electrode 6 by a lift-off method, for thus finishing the fabrication of the structure.

As described above, the three-dimensional cavity surface emitting laser structure and a fabrication method thereof according to the present invention has the following advantages.

First, light from the vertical cavity laser is laterally confined, for thus increasing the optical gain and significantly decreasing the threshold voltage.

Second, it is possible to control the current injection path in the cavity by applying electric fields to the sidewall of the laser cavity, resulting in a stable transverse mode characteristic.

Third, it is possible to decrease the current laterally flowing toward the sidewall of the laser post by applying electrical fields to the sidewall of the laser cavity, for thus decreasing the threshold current by decreasing the sidewall leakage current.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for fabricating a three-dimensional cavity surface emitting laser structure, comprising the steps of:

sequentially forming a bottom mirror region, an active region, and a top mirror region on a semiconductor substrate;

forming a top electrode, which comprises one of a p-type and an n-type electrode, on said top mirror region, forming a first metal film pattern, etching a part of said top mirror region, said active region, and said bottom mirror region by using said first metal film pattern as an etching mask, and forming a laser post;

forming an insulating film on the resultant structure after said step of etching a part of said top mirror;

forming a sidewall mirror second metal film pattern on said insulation film on a side wall of said laser post;

exposing a surface of said top electrode;

coating a planarization polyimide film on an upper surface of the resultant surface after said step of exposing;

forming a pad of a sidewall mirror second metal film; and forming a metal pad on said top electrode.

2. The method of claim 1, wherein said insulation film is formed to have a thickness of 1000 A to 5000 A.

3. The method of claim 1, wherein said step of exposing a surface of said top electrode comprises the substeps of:

forming one of a photoresist film and a polyimide film;

ashing an upper portion of said one of said photoresist film and said polyimide film for exposing said second metal film pattern formed on an upper portion of said top electrode; and removing said second metal film pattern and said upper portion of said top electrode and etching an exposed portion of said insulation film.

* * * * *